(12) United States Patent
Sekiguchi

(10) Patent No.: US 9,263,570 B2
(45) Date of Patent: Feb. 16, 2016

(54) SEMICONDUCTOR DEVICE INCLUDING A HIGH BREAKDOWN VOLTAGE DMOS AND METHOD OF MANUFACTURING THE SAME

(71) Applicant: ROHM CO., LTD., Kyoto (JP)

(72) Inventor: Yushi Sekiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 72 days.

(21) Appl. No.: 13/967,705

(22) Filed: Aug. 15, 2013

(65) Prior Publication Data
US 2014/0048876 A1 Feb. 20, 2014

(30) Foreign Application Priority Data
Aug. 17, 2012 (JP) ................. 2012-181158

(51) Int. Cl.
| | |
|---|---|
| H01L 29/78 | (2006.01) |
| H01L 29/66 | (2006.01) |
| H01L 21/8238 | (2006.01) |
| H01L 29/423 | (2006.01) |
| H01L 29/08 | (2006.01) |

(52) U.S. Cl.
CPC ...... H01L 29/7801 (2013.01); H01L 21/82385 (2013.01); H01L 21/823814 (2013.01); H01L 21/823857 (2013.01); H01L 29/42368 (2013.01); H01L 29/66674 (2013.01); H01L 29/66689 (2013.01); H01L 29/7816 (2013.01); *H01L 29/086* (2013.01); *H01L 29/0878* (2013.01)

(58) Field of Classification Search
CPC ........ H01L 29/78; H01L 29/66; H01L 29/256

USPC .................. 257/338, 330, 335, 339, 344, 343
See application file for complete search history.

(56) References Cited

U.S. PATENT DOCUMENTS

| | | | |
|---|---|---|---|
| 2004/0046211 A1* | 3/2004 | Shimotsusa et al. .......... | 257/368 |
| 2007/0264785 A1* | 11/2007 | Choi et al. ..................... | 438/297 |
| 2007/0278570 A1* | 12/2007 | Knaipp et al. ................ | 257/339 |
| 2010/0078715 A1* | 4/2010 | Lee ................................ | 257/330 |
| 2010/0301411 A1* | 12/2010 | Takeda et al. ................ | 257/335 |
| 2014/0021546 A1* | 1/2014 | Onoda .......................... | 257/344 |
| 2014/0042527 A1* | 2/2014 | Lee et al. ...................... | 257/330 |

FOREIGN PATENT DOCUMENTS

JP 2009-032820 A 2/2009

* cited by examiner

*Primary Examiner* — Chuong A Luu
(74) *Attorney, Agent, or Firm* — Rabin & Berdo, P.C.

(57) ABSTRACT

A semiconductor device includes a high breakdown voltage DMOS transistor formed on a first conductivity type semiconductor substrate. The semiconductor device includes: a DMOS second conductivity type well; a DMOS first conductivity body region; a DMOS second conductivity type source region; a DMOS second conductivity type drain region; a LOCOS oxide film formed between the DMOS second conductivity type drain region and the DMOS first conductivity type body region; and a DMOS gate insulating film formed in succession to the LOCOS oxide film to cover a DMOS channel region between the DMOS second conductivity type source region and the DMOS second conductivity type well, wherein the DMOS gate insulating film includes a first insulating film which is disposed outside the DMOS channel region and a second insulating film which is disposed in the DMOS channel region and is thinner than the first insulating film.

13 Claims, 28 Drawing Sheets

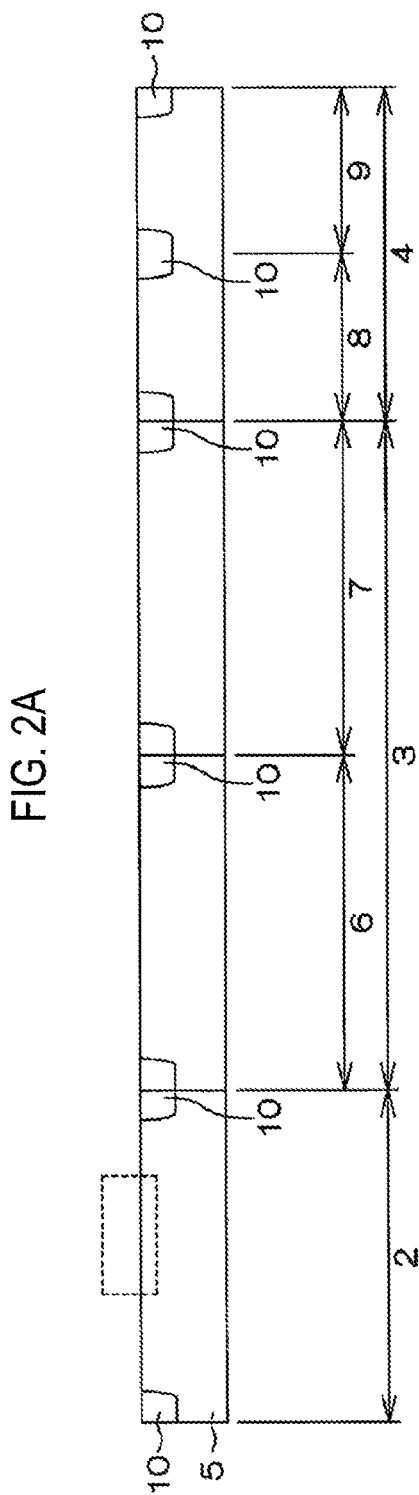

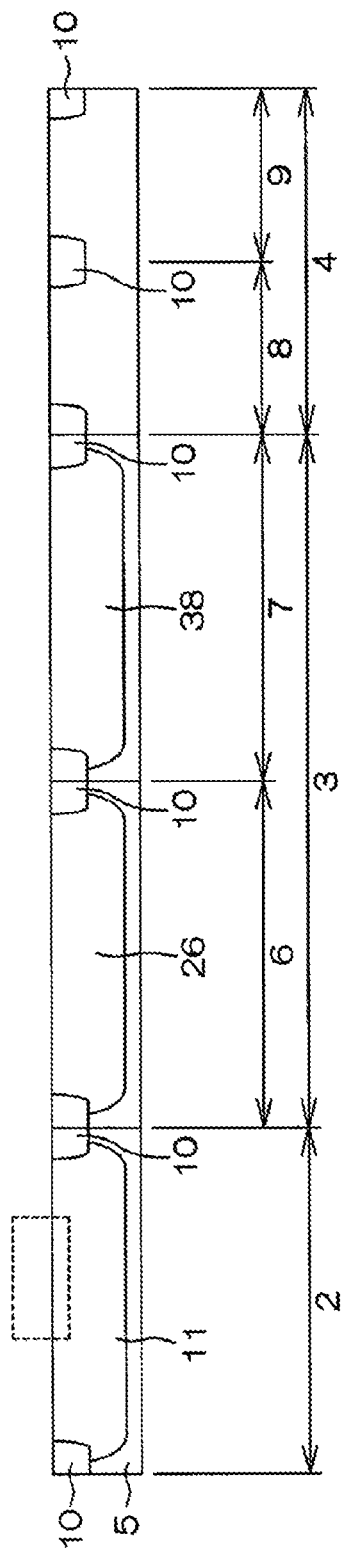

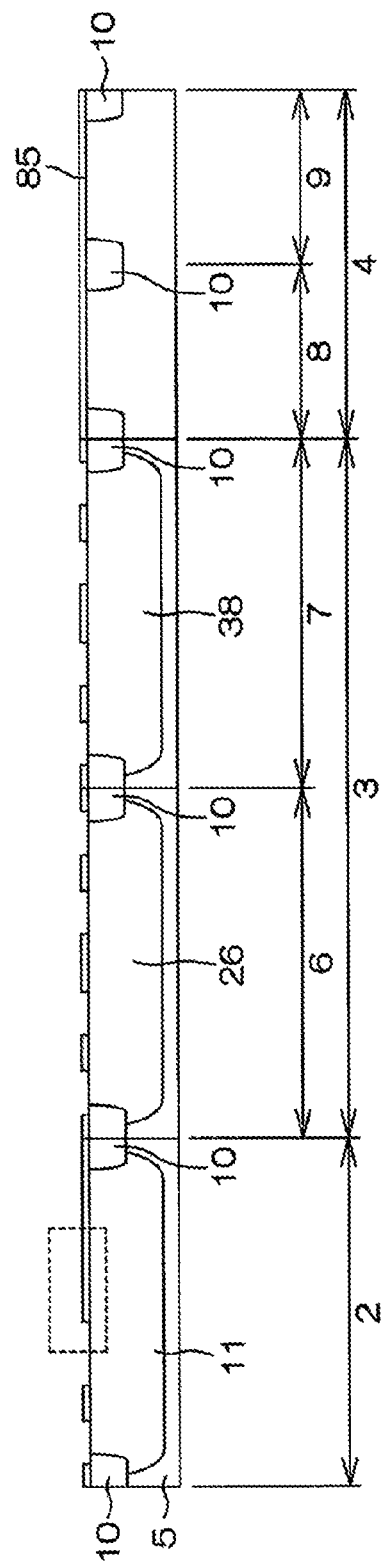

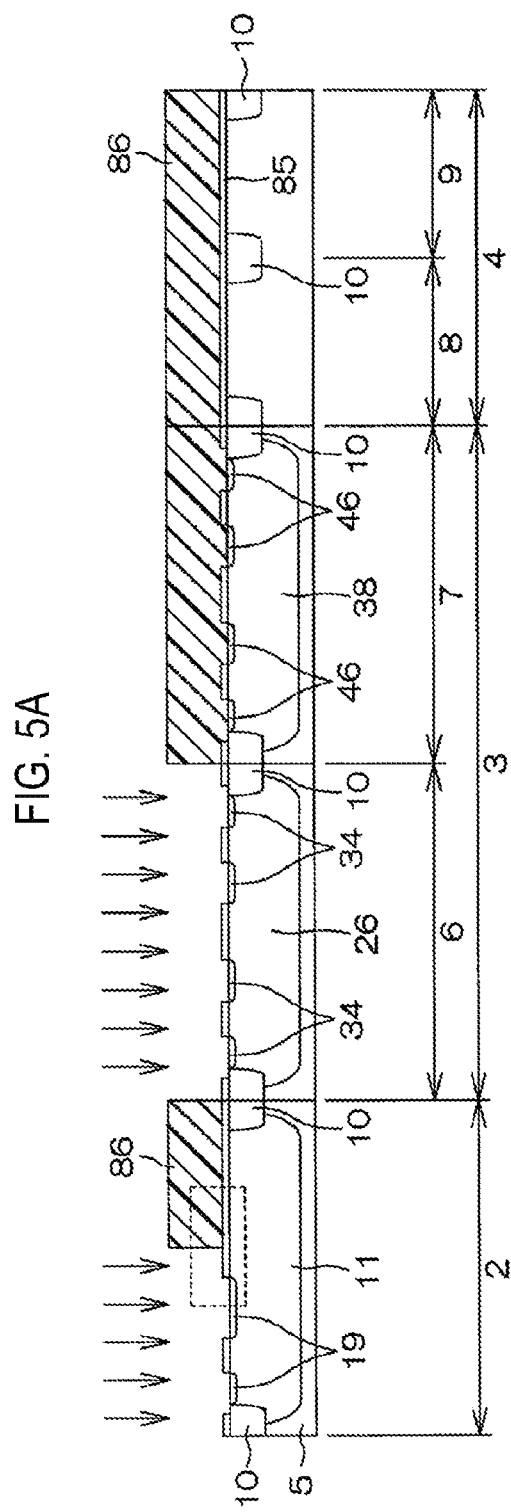

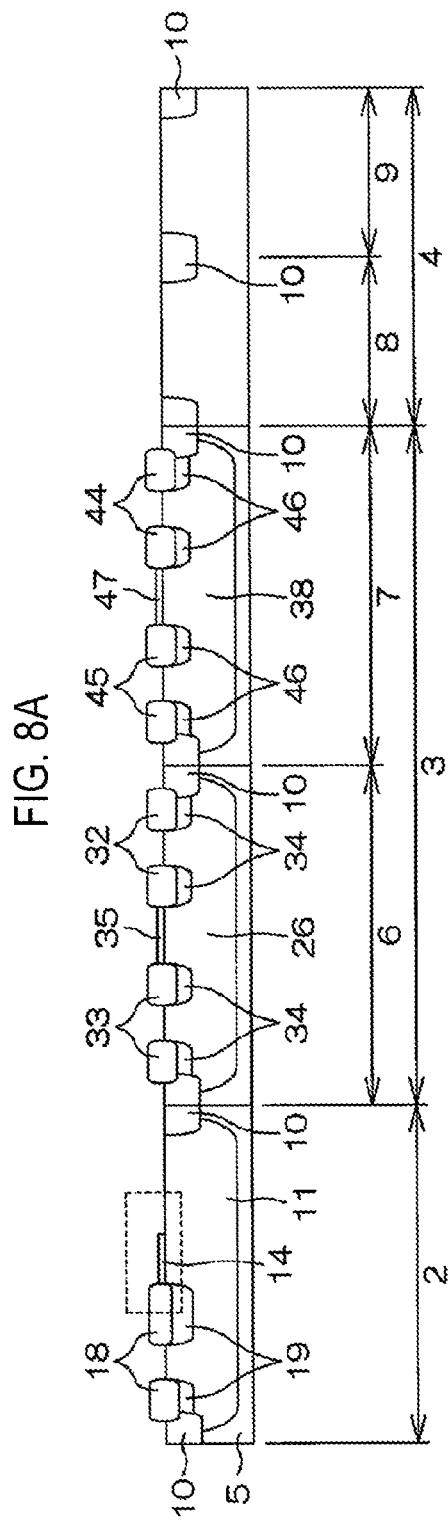

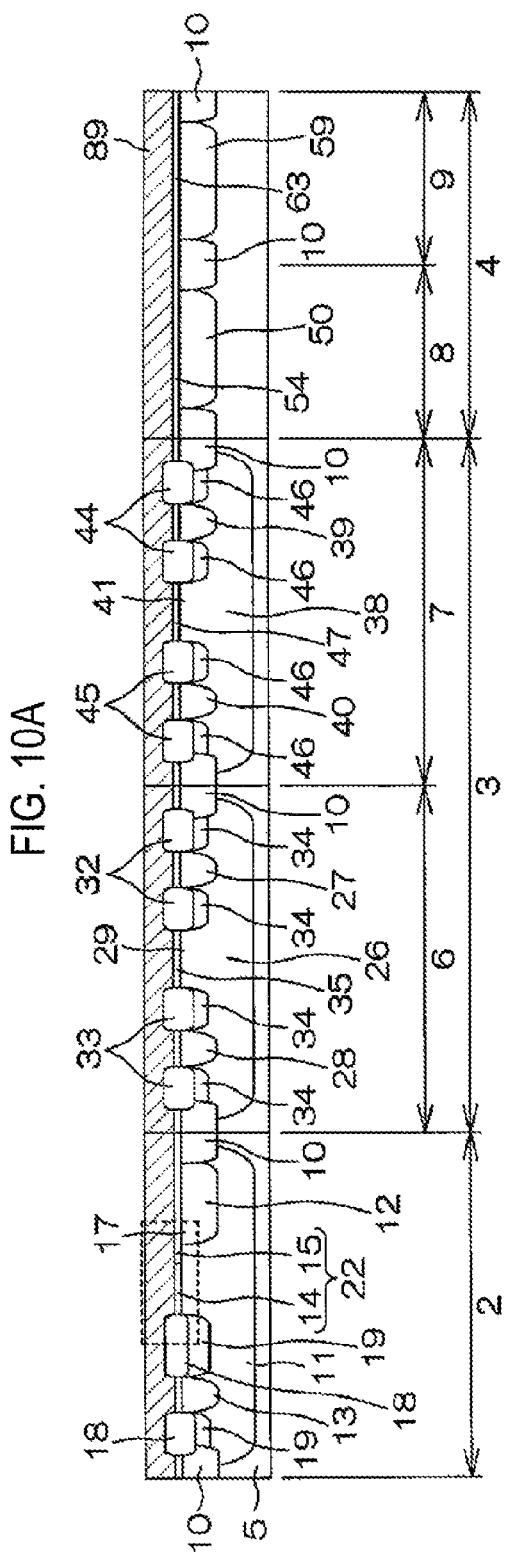

SEMICONDUCTOR DEVICE INCLUDING A HIGH BREAKDOWN VOLTAGE DMOS AND METHOD OF MANUFACTURING THE SAME

CROSS-REFERENCE TO RELATED APPLICATION

This application is based upon and claims the benefit of priority from Japanese Patent Application No. 2012-181158, filed on Aug. 17, 2012, the entire contents of which are incorporated herein by reference.

TECHNICAL FIELD

The present disclosure relates to a semiconductor device and a method of manufacturing the same.

BACKGROUND

There have been conventionally known semiconductor devices including high breakdown voltage DMOS (Double-diffused Metal Oxide Semiconductor) transistors. In one example, a LDMOS (Lateral Double-diffused Metal Oxide Semiconductor) transistor is formed on an n type ($n^-$) semiconductor substrate. The LDMOS transistor includes a p conductivity type (p) base region formed on a front surface of the semiconductor substrate and an n conductivity type ($n^+$) source region formed on a surface of the base region. In addition, an n conductivity type (n) drift region having a concentration higher than that of the semiconductor substrate is formed on the front surface of the semiconductor substrate at the opposite side of the source region with the base region interposed therebetween. An n conductivity type ($n^+$) drain region having a concentration higher than that of the drift region is formed on a surface of the drift region. Further, a gate electrode to cover a portion of the base region via a gate oxide film is formed on the semiconductor substrate. In addition, a LOCOS (Local Oxidation of Silicon) oxide film to cover a portion of the drift region is formed on the semiconductor substrate.

In the LDMOS transistor of the related art, if the thickness of the gate insulating film has a relatively large thickness of 1000 Å to 1500 Å in consideration of a breakdown voltage of the LDMOS transistor, a gate threshold voltage is increased and leads to insufficient performance of the LDMOS transistor. Making the gate oxide film thinner may resolve such drawback. However, since portions other than the base region of the gate oxide film become thinner simultaneously, there may be a problem in that a gate-drain breakdown voltage cannot be maintained. To avoid this problem, widening a formation region of the LOCOS oxide film has been considered to mitigate a gate drain electric field.

However, if the formation region of the LOCOS oxide film is widened to be closer to the base region, a thick portion called a bird's beak of the LOCOS oxide film may contact a channel, which results in poor transistor performance.

SUMMARY

The present disclosure provides some embodiments of a semiconductor device and a method of manufacturing the same, which are capable of providing a high breakdown voltage DMOS transistor achieving sufficient transistor performance while preventing a gate-drain breakdown voltage from being decreased.

According to one embodiment of the present disclosure, there is provided a semiconductor device including a high breakdown voltage DMOS transistor formed on a first conductivity type semiconductor substrate, including: a DMOS second conductivity type well formed in a region for the high breakdown voltage DMOS transistor of the semiconductor substrate; a DMOS first conductivity body region formed in an inner region of the DMOS second conductivity type well; a DMOS second conductivity type source region formed in an inner region of the DMOS first conductivity type body region; a DMOS second conductivity type drain region formed in an inner region of the DMOS second conductivity type well and separated by a distance from the DMOS first conductivity type body region; a LOCOS oxide film formed between the DMOS second conductivity type drain region and the DMOS first conductivity type body region, the LOCOS oxide film being adjacent to the DMOS second conductivity type drain region; a DMOS gate insulating film formed in succession to the LOCOS oxide film to cover a DMOS channel region between the DMOS second conductivity type source region and the DMOS second conductivity type well, the DMOS gate insulating film being thinner than the LOCOS oxide film; and a DMOS gate electrode formed to straddle the LOCOS oxide film and the DMOS gate insulating film, the DMOS gate electrode facing the DMOS channel region through the DMOS gate insulating film, wherein the DMOS gate insulating film includes a first insulating film which is disposed outside the DMOS channel region, and a second insulating film which is disposed in the DMOS channel region and is thinner than the first insulating film.

With this configuration, since the DMOS gate insulating film is interposed between the LOCOS oxide film and the DMOS channel region, it is possible to prevent the DMOS channel region from being covered by the LOCOS oxide film. In addition, the relatively thin second insulating film is formed on the DMOS channel region of the DMOS gate insulating film. This allows the high breakdown voltage DMOS transistor to be controlled by a proper gate voltage, thereby showing sufficient transistor performance.

In addition, since the first insulating film thicker than the second insulating film is arranged in a portion outside the DMOS channel region of the DMOS gate insulating film, a gate-drain breakdown voltage can be sufficiently maintained.

In some embodiments, the semiconductor device further includes: a high breakdown voltage CMOS transistor and a low breakdown voltage CMOS transistor formed on the semiconductor substrate; a high breakdown voltage source region and a high breakdown voltage drain region formed in a region for the high breakdown voltage CMOS transistor of the semiconductor substrate and separated by a distance from each other; a high breakdown voltage gate insulating film formed to cover a high breakdown channel region between the high breakdown voltage source region and the high breakdown voltage drain region; a high breakdown voltage gate electrode formed on the high breakdown voltage gate insulating film and facing the high breakdown voltage channel region via the high breakdown voltage gate insulating film; a low breakdown voltage source region and a low breakdown voltage drain region formed in a region for the low breakdown voltage CMOS transistor of the semiconductor substrate and separated by a distance from each other; a low breakdown voltage gate insulating film formed to cover a low breakdown channel region between the low breakdown voltage source region and the low breakdown voltage drain region; and a low breakdown voltage gate electrode formed on the low breakdown voltage gate insulating film and facing the low breakdown voltage channel region via the low breakdown voltage gate insulating film, wherein the first insulating film of the DMOS gate insulating film is formed with the same thickness as the high breakdown voltage gate insulating film, and the second insulating film of the DMOS gate insulating film is formed with the same thickness as the low breakdown voltage gate insulating film.

With this configuration, the first insulating film can be formed in the same process as the high breakdown voltage gate insulating film and the second insulating film can be formed in the same process as the low breakdown voltage gate insulating film. This can result in simplification of a semiconductor device manufacturing method.

In some embodiments, the semiconductor device further includes a DMOS second conductivity type drift region formed below the LOCOS oxide film of the semiconductor substrate and with an impurity concentration higher than that of the DMOS second conductivity type well.

With this configuration, parasite resistance of the drain can be lowered by the DMOS second conductivity type drift region. In addition, the DMOS second conductivity type drift region is formed below the LOCOS oxide film and is separated by a distance from the DMOS first conductivity type body region. This can prevent the DMOS second conductivity type drift region from contacting the DMOS first conductivity type body region, thereby preventing decrease in a junction breakdown voltage due to such contact. In addition, the DMOS second conductivity type drift region may be formed in self-alignment with the LOCOS oxide film.

In some embodiments, the thickness of the LOCOS oxide film is 2000 Å to 3000 Å, the thickness of the first insulating film is 1000 Å to 1500 Å and the thickness of the second insulating film is 80 Å to 150 Å.

In some embodiments, the semiconductor device further includes an element isolation portion having a STI (Shallow Trench Isolation) structure in which grooves dug down from the front surface of the semiconductor substrate are filled with insulating material, the element isolation portion partitioning regions for the high breakdown voltage DMOS transistor, the high breakdown voltage CMOS transistor and the low breakdown voltage CMOS transistor.

In some embodiments, the region for the low breakdown voltage CMOS transistor partitioned by the element isolation portion has a size of equal to or less than 0.18 μm.

According to another embodiment of the present disclosure, there is provided a method of manufacturing a semiconductor device including a high breakdown voltage DMOS transistor, a high breakdown voltage CMOS transistor and a low breakdown voltage CMOS transistor, all of which are formed on a common first conductivity type semiconductor substrate, including: forming a DMOS second conductivity type well by selectively injecting second conductivity type impurities into a region for the high breakdown voltage DMOS transistor of the semiconductor substrate; selectively forming a LOCOS oxide film in the DMOS second conductivity type well by selectively thermally oxidizing the semiconductor substrate; forming a DMOS first conductivity body region to be separated by a distance from the LOCOS oxide film by selectively injecting first conductivity type impurities into an inner region of the DMOS second conductivity type well; forming a DMOS second conductivity type source region by selectively injecting second conductivity type impurities into an inner region of the DMOS first conductivity type body region; forming a DMOS second conductivity type drain region in self-alignment with the LOCOS oxide film by selectively injecting second conductivity type impurities into an inner region of the DMOS second conductivity type well; forming a high breakdown voltage source region and a high breakdown voltage drain region to be separated by a distance from each other by selectively injecting impurities into the region for the high breakdown voltage CMOS transistor of the semiconductor substrate; forming a low breakdown voltage source region and a low breakdown voltage drain region to be separated by a distance from each other by selectively injecting impurities into the region for the low breakdown voltage CMOS transistor of the semiconductor substrate; forming a high breakdown voltage gate insulating film between the high breakdown voltage source region and the high breakdown voltage drain region and forming a first insulating film in a region outside the DMOS channel region between the DMOS second conductivity type source region and the DMOS second conductivity type well, the first insulating film being connected to the LOCOS oxide film, by selectively thermally oxidizing the semiconductor substrate; forming a low breakdown voltage gate insulating film between the low breakdown voltage source region and the low breakdown voltage drain region, the low breakdown voltage gate insulating film being thinner than the high breakdown voltage gate insulating film, forming a second insulating film in the DMOS channel region, the second insulating film being thinner than the first insulating film and being integrated with the first insulating film, by selectively thermally oxidizing the semiconductor substrate, and thereby forming a DMOS gate insulating film including the first insulating film and the second insulating film; forming a DMOS gate electrode to straddle the LOCOS oxide film and the DMOS gate insulating film, the DMOS gate electrode facing the DMOS channel region through the DMOS gate insulating film; forming a high breakdown voltage gate electrode on the high breakdown voltage gate insulating film, the high breakdown voltage gate electrode facing the high breakdown voltage channel region between the high breakdown voltage source region and the high breakdown voltage drain region via the high breakdown voltage gate insulating film; and forming a low breakdown voltage gate electrode on the low breakdown voltage gate insulating film, the low breakdown voltage gate electrode facing the low breakdown voltage channel region between the low breakdown voltage source region and the low breakdown voltage drain region via the low breakdown voltage gate insulating film.

With the semiconductor device manufactured according to the above-described method, since the DMOS gate insulating film is interposed between the LOCOS oxide film and the DMOS channel region, it is possible to prevent the DMOS channel region from being covered by the LOCOS oxide film. In addition, the relatively thin second insulating film is formed on the DMOS channel region of the DMOS gate insulating film. This allows the high breakdown voltage DMOS transistor to be controlled by a proper gate voltage, thereby showing sufficient transistor performance.

In addition, since the first insulating film thicker than the second insulating film is arranged in a portion outside the DMOS channel region of the DMOS gate insulating film, a gate-drain breakdown voltage can be sufficiently maintained.

In addition, the first insulating film can be formed in the same process as the high breakdown voltage gate insulating film and the second insulating film can be formed in the same process as the low breakdown voltage gate insulating film. This can result in simplification of a semiconductor device manufacturing method.

In some embodiments, the forming a high breakdown voltage source region and a high breakdown voltage drain region is performed at the same time as the forming a DMOS second conductivity type drain region and includes forming a high breakdown voltage second conductivity type source region and a high breakdown voltage second conductivity type drain region in the region for the high breakdown voltage CMOS transistor of the semiconductor substrate, the high breakdown voltage second conductivity type source region and the high breakdown voltage second conductivity type drain region being separated by a distance from each other.

With this method, since the high breakdown voltage second conductivity type source/drain regions can be formed in the same process as the DMOS second conductivity type drain region, it is possible to further simplify a semiconductor device manufacturing method. In some embodiments, the forming a high breakdown voltage source region and a high breakdown voltage drain region is performed at the same time as the forming a DMOS first conductivity type body region and includes forming a high breakdown voltage first conductivity type source region and a high breakdown voltage first conductivity type drain region in the region for the high breakdown voltage CMOS transistor of the semiconductor substrate, the high breakdown voltage first conductivity type source region and the high breakdown voltage first conductivity type drain region being separated by a distance from each other.

With this method, since the high breakdown voltage first conductivity type source/drain regions can be formed in the same process as the DMOS first conductivity type body region, it is possible to further simplify a semiconductor device manufacturing method.

BRIEF DESCRIPTION OF THE DRAWINGS

FIGS. 2A and 2B are schematic views showing a process of a manufacturing method of the semiconductor device.

FIGS. 3A and 3B are schematic views showing a process subsequent to the process of FIGS. 2A and 2B.

FIGS. 4A and 4B are schematic views showing a process subsequent to the process of FIGS. 3A and 3B.

FIGS. 5A and 5B are schematic views showing a process subsequent to the process of FIGS. 4A and 4B.

FIGS. 8A and 8B are schematic views showing a process subsequent to the process of FIGS. 7A and 7B.

FIGS. 10A and 10B are schematic views showing a process subsequent to the process of FIGS. 9A and 9B.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1A:
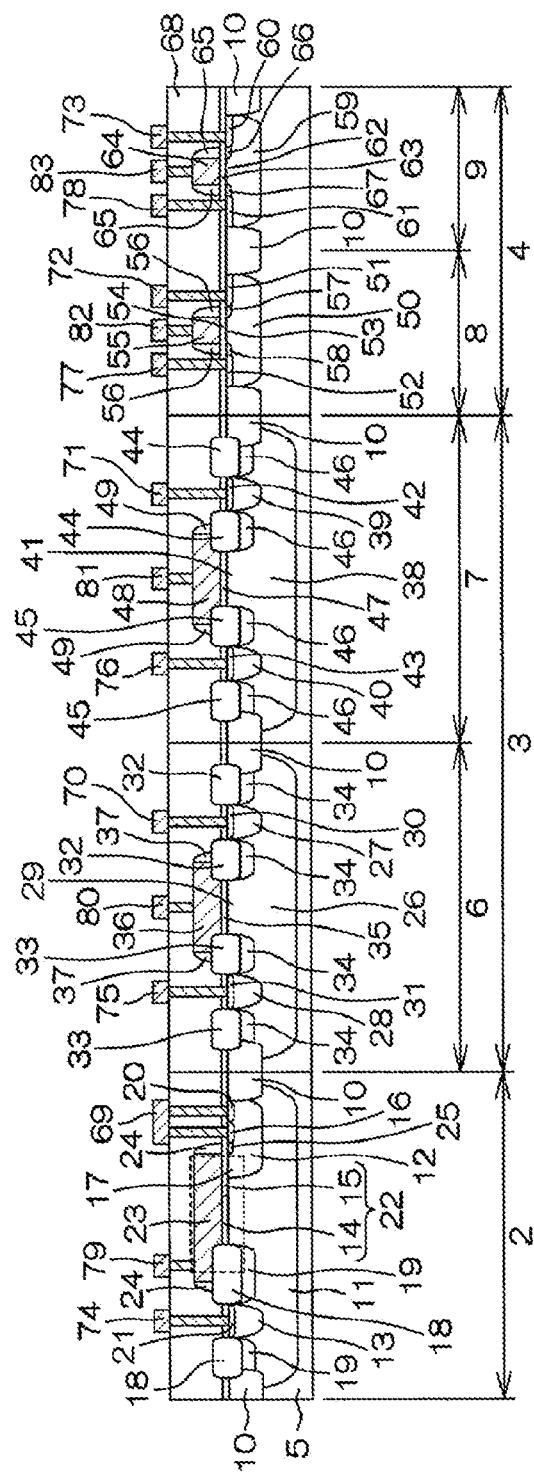
FIG. 1A is a schematic sectional view of a semiconductor device according to one embodiment of the present disclosure.
Figure 1B:
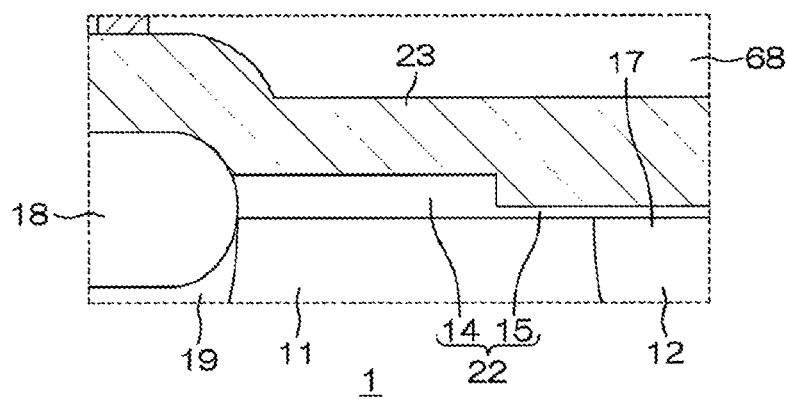
FIG. 1B is an enlarged view of a main part of an HV-DMOS region indicated by dotted lines in FIG. 1A.

Embodiments of the present disclosure will now be described in detail with reference to the drawings. FIG. 1A is a schematic sectional view of a semiconductor device 1 according to one embodiment of the present disclosure, and FIG. 1B is an enlarged view of a main part of an HV-DMOS region indicated by dotted lines in FIG. 1A. As shown in FIG. 1A, the semiconductor device 1 includes a HV-DMOS (High Voltage Double-diffused Metal Oxide Semiconductor) 2 as one example of a high breakdown voltage DMOS transistor of the present disclosure, a HV-CMOS (High Voltage Complementary Metal Oxide Semiconductor) 3 as one example of a high breakdown voltage CMOS transistor of the present disclosure, and a LV-CMOS 4 as one example of a low breakdown voltage CMOS transistor of the present disclosure, all of which are formed on a common p type semiconductor substrate (for example, a silicon substrate) 5. The HV-CMOS 3 includes a HV-nMOS 6 and a HV-pMOS 7 and the LV-CMOS 4 includes a LV-nMOS 8 and a LV-pMOS 9.

Element isolation portions 10 that isolate the HV-DMOS 2, the HV-nMOS 6, the HV-pMOS 7, the LV-nMOS 8 and the LV-pMOS 9 from each other are formed on a front surface of the semiconductor substrate 5. The element isolation portions 10 surround regions where the HV-DMOS 2, the HV-nMOS 6, the HV-pMOS 7, the LV-nMOS 8 and the LV-pMOS 9 are to be formed, for example, in the form of a rectangle. The element isolation portions 10 have a STI (Shallow Trench Isolation) structure in which grooves dug relatively shallow down from the front surface of the semiconductor substrate 5 (for example, shallow trenches having a depth of 0.2 μm to 0.5 μm) are filled with insulating material such as silicon oxide ($SiO_2$) or the like.

A size (i.e., width in a horizontal direction of FIG. 1A) of the region for the HV-DMOS 2 partitioned by the element isolation portions 10 is, for example, 10 μm to 100 μm. A size of the region for the HV-CMOS 3 is, for example, 10 μm to 200 μm. More specifically, a size of the region for the HV-nMOS 6 is 10 μm to 100 μm and a size of the region for the HV-pMOS 7 is 10 μmm to 200 μmm.

A size of the region for the LV-CMOS 4 is, for example, 1 μm to 10 μm. More specifically, a size of the region for the LV-nMOS 8 is 1 μm to 10 μm and a size of the region for the LV-pMOS 9 is 1 μmm to 10 μmm A dip n type well 11, as one example of a DMOS second conductivity type well, is formed in the region for the HV-DMOS 2, surrounded by the element isolation portions 10 in the form of a rectangle.

In an inner region of the dip n type well 11 are formed a DMOS-p type body region 12 as one example of a DMOS first conductivity type body region and a DMOS-n type drain region 13 as one example of a DMOS second conductivity type drain region, both of which are separated from each other along the front surface of the semiconductor substrate 5. In an inner region of the DMOS-p type body region 12 is formed a DMOS-n type source region 16 as one example of a DMOS second conductivity type source region, which is separated from the DMOS-n type drain region 13 with respect to a boundary between the dip n type well 11 and the DMOS-p type body region 12. A region between the DMOS-n type source region 16 and the dip n type well 11 corresponds to a channel region (a DMOS channel region 17) of the DMOS-p type body region 12.

On the front surface of the semiconductor substrate 5 are formed LOCOS oxide films 18 at both sides of the DMOS-n type drain region 13. Below each LOCOS oxide film 18 is formed a DMOS-n type drift region 19 as one example of a DMOS second conductivity type drift region in self-alignment with the LOCOS oxide film 18 in such a manner that the DMOS-n type drift region 19 is in contact with the LOCOS oxide film 18. The DMOS-n type drift region 19 is formed to be shallower than the DMOS-n type drain region 13.

On a front surfaces of the DMOS-p type body region 12 and the DMOS-n type drain region 13 are respectively formed a DMOS body contact region 20 and a DMOS drain contact region 21, each of which is heavily doped with impurities. The DMOS body contact region 20 is formed at the opposite side of the DMOS channel region 17 with respect to the DMOS-n type source region 16.

A DMOS gate insulating film 22 is formed on the front surface of the semiconductor substrate 5 in the region for the HV-DMOS 2. As shown in FIG. 1B, the DMOS gate insulating film 22 and the LOCOS oxide film 18 are formed in sequence. The DMOS gate insulating film 22 includes a first insulating film 14 which is relatively thick and disposed outside the DMOS channel region 17 and a second insulating film 15 which is thinner than the first insulating film 14 and partially disposed in the DMOS channel region 17, in an integrated manner. Thus, the LOCOS oxide film 18, the first insulating film 14 and the second insulating film 15 are arranged in this order from the DMOS-n type drain region 13 toward the DMOS channel region 17 in such a manner to decrease insulating film thickness in three steps.

In this embodiment, a boundary between the first insulating film 14 and the second insulating film 15 is set at the opposite side of the DMOS channel region 17 with respect to the boundary between the dip n type well 11 and the DMOS-p type body region 12. The position of this boundary is set such that a width covered by the first insulating film 14 is, for example, 0.5 μm to 1.5 μm. This allows a neighborhood of the DMOS-p type body region 12 in a region between the DMOS-n type drift regions 19 and the DMOS-p type body region 12 to be selectively covered by the second insulating film 15.

In addition, a DMOS gate electrode 23 is formed to face the DMOS channel region 17 with the DMOS gate insulating film 22 interposed therebetween. In this embodiment, the DMOS gate electrode 23 is formed to straddle the LOCOS oxide film 18 and the DMOS gate insulating film 22. An end (edge) of a drain side of the DMOS gate electrode 23 is placed on the LOCOS oxide film 18 at a distance from the DMOS-n type drain region 13. On the other hand, an end (edge) of a source side of the DMOS gate electrode 23 is placed at a distance from the DMOS-n type source region 16.

In addition, both sides of the DMOS gate electrode 23 are covered with a side wall 24 made of insulating material such as silicon oxide ($SiO_2$) or the like. An n type low concentration layer 25 is formed between the DMOS-n type source region 16 and the DMOS gate electrode 23, i.e., in a region immediately below the side wall 24, thereby forming an LDD structure. The n type low concentration layer 25 has a concentration lower than that of the DMOS-n type source region 16 and is formed by implanting impurity ions at a depth shallower than the DMOS-n type source region 16. The n type low concentration layer 25 is formed in self-alignment with the DMOS gate electrode 23, while the DMOS-n type source region 16 is formed in self-alignment with the side wall 24.

In the region for the HV-nMOS 6 of the HV-CMOS 3 surrounded by the element isolation portions 10 in the form of a rectangle is formed a dip p type well 26. In an inner region of the dip p type well 26 are formed a HV-n type source region 27 as one example of a high breakdown voltage source region and a HV-n type drain region 28 as one example of a high breakdown voltage drain region, both of which are separated by a distance from each other along the front surface of the semiconductor substrate 5. A region between the HV-n type source region 27 and the HV-n type drain region 28 corresponds to a channel region (a HV-n type channel region 29) of the dip p type well 26. In addition, the HV-n type source region 27 and the HV-n type drain region 28 are formed at the same impurity concentration and depth as the DMOS-n type drain region 13.

On a front surfaces of the HV-n type source region 27 and the HV-n type drain region 28 are respectively formed a HV-n type source contact region 30 and a HV-n type drain contact region 31, each of which is heavily doped with impurities. On the front surface of the semiconductor substrate 5 are formed LOCOS oxide films 32 at both sides of the HV-n type source region 27. In addition, on the front surface of the semiconductor substrate 5 are formed LOCOS oxide films 33 at both sides of the HV-n type drain region 28. Below each LOCOS oxide film 32 and 33 is formed a HV-n type drift region 34 in self-alignment with the LOCOS oxide films 32 and 33 in such a manner that the HV-n type drift region 34 is in contact with the LOCOS oxide films 32 and 33. The HV-n type drift region 34 is formed to be shallower than the HV-n type source region 27 and the HV-n type drain region 28.

A HV-nMOS gate insulating film 35 as one example of a high breakdown voltage gate insulating film is formed on the front surface of the semiconductor substrate 5 in the region for the HV-nMOS 6. The HV-nMOS gate insulating film 35 is formed with the same thickness as the first insulating film 14 of the DMOS gate insulating film 22. In addition, a HV-nMOS gate electrode 36 as one example of a high breakdown voltage gate electrode is formed to face the HV-nMOS channel region 29 with the HV-nMOS gate insulating film 35 interposed therebetween.

In this embodiment, the HV-nMOS gate electrode 36 is formed to straddle the LOCOS oxide film 32 and the LOCOS oxide film 33. An end (edge) of a drain side of the HV-nMOS gate electrode 36 is placed on the LOCOS oxide film 33 at a distance from the HV-n type drain region 28. On the other hand, an end (edge) of a source side of the HV-nMOS gate electrode 36 is placed on the LOCOS oxide film 32 at a distance from the HV-n type source region 27. In addition, both sides of the HV-nMOS gate electrode 36 are covered with a side wall 37 made of insulating material such as silicon oxide ($SiO_2$) or the like.

In the region for the HV-pMOS 7 of the HV-CMOS 3 surrounded by the element isolation portions 10 in the form of a rectangle is formed a dip n type well 38. The dip n type well 38 is formed at the same impurity concentration and depth as the dip n type well 11 of the HV-DMOS 2. In an inner region of the dip n type well 26 are formed a HV-p type source region 39 as one example of a high breakdown voltage source region, and a HV-p type drain region 40 as one example of a high breakdown voltage drain region, both of which are separated by a distance from each other along the front surface of the semiconductor substrate 5. A region between the HV-p type source region 39 and the HV-p type drain region 40 corresponds to a channel region (a HV-p type channel region 41) of the dip n type well 38. In addition, the HV-p type source region 39 and the HV-p type drain region 40 are formed at the same impurity concentration and depth as the DMOS-p type body region 12.

On a front surfaces of the HV-p type source region 39 and the HV-p type drain region 40 are respectively formed a HV-p type source contact region 42 and a HV-p type drain contact region 43, each of which is heavily doped with impurities. On the front surface of the semiconductor substrate 5 are formed LOCOS oxide films 44 at both sides of the HV-p type source region 39. In addition, on the front surface of the semiconductor substrate 5 are formed LOCOS oxide films 45 at both sides of the HV-p type drain region 40. Below each LOCOS oxide film 44 and 45 is formed a HV-p type drift region 46 in self-alignment with the LOCOS oxide films 44 and 45 in such a manner that the HV-p type drift region 46 is in contact with the LOCOS oxide films 44 and 45. The HV-p type drift region 46 is formed to be shallower than the HV-p type source region 39 and the HV-p type drain region 40.

A HV-pMOS gate insulating film 47 as one example of a high breakdown voltage gate insulating film is formed on the front surface of the semiconductor substrate 5 in the region for the HV-pMOS 7. The HV-pMOS gate insulating film 47 is formed with the same thickness as the first insulating film 14 of the DMOS gate insulating film 22. In addition, a HV-pMOS gate electrode 48 as one example of a high breakdown voltage gate electrode is formed to face the HV-p type channel region 41 with the HV-pMOS gate insulating film 47 interposed therebetween.

In this embodiment, the HV-pMOS gate electrode 48 is formed to straddle the LOCOS oxide film 44 and the LOCOS oxide film 45. An end (edge) of a drain side of the HV-pMOS gate electrode 48 is placed on the LOCOS oxide film 45 at a distance from the HV-p type drain region 40. On the other hand, an end (edge) of a source side of the HV-pMOS gate electrode 48 is placed on the LOCOS oxide film 44 at a distance from the HV-p type source region 39. In addition, both sides of the HV-pMOS gate electrode 48 are covered with a side wall 49 made of insulating material such as silicon oxide ($SiO_2$) or the like.

In the region for the LV-nMOS 8 of the LV-CMOS 4 surrounded by the element isolation portions 10 in the form of a rectangle is formed a p type well 50. The p type well 50 is formed with an impurity concentration higher than that of the dip p type well 26 but at a depth shallower than the dip p type well 26. In addition, the p type well 50 is formed at the same impurity concentration and depth as the DMOS-p type body region 12, the HV-p type source region 39 and the HV-p type drain region 40.

In an inner region of the p type well 50 are formed a LV-n type source region 51 as one example of a low breakdown voltage source region and a LV-n type drain region 52 as one example of a low breakdown voltage drain region, both of which are separated by a distance from each other along the front surface of the semiconductor substrate 5. A region between the LV-n type source region 51 and the LV-n type drain region 52 corresponds to a channel region (a LV-n type channel region 53) of the p type well 50.

A LV-nMOS gate insulating film 54 as one example of a low breakdown voltage gate insulating film is formed on the front surface of the semiconductor substrate 5 in the region for the LV-nMOS 8. The LV-nMOS gate insulating film 54 is formed with the same thickness as the second insulating film 15 of the DMOS gate insulating film 22. In addition, a LV-nMOS gate electrode 55 as one example of a low breakdown voltage gate electrode is formed to face the LV-n type channel region 53 with the LV-nMOS gate insulating film 54 interposed therebetween.

Both sides of the LV-nMOS gate electrode 55 are covered with a side wall 56 made of insulating material such as silicon oxide ($SiO_2$) or the like. N type low concentration layers 57 and 58 are formed between the LV-n type source region 51 and the LV-nMOS gate electrode 55 and between the LV-n type drain region 52 and the LV-nMOS gate electrode 55, respectively, i.e., in a region immediately below the side wall 56, thereby forming an LDD structure. The n type low concentration layers 57 and 58 have a concentration lower than that of the LV-n type source and drain regions 51 and 52 and are formed by implanting impurity ions at a depth shallower than these regions 51 and 52. The n type low concentration layers 57 and 58 are formed in self-alignment with the LV-nMOS gate electrode 55, while the LV-n type source and drain regions 51 and 52 are formed in self-alignment with the side wall 56.

In the region for the LV-pMOS 9 of the LV-CMOS 4 surrounded by the element isolation portions 10 in the form of a rectangle is formed an n type well 59. The n type well 59 is formed with an impurity concentration higher than that of the dip n type well 11 and the dip n type well 38 but at a depth shallower than the dip n type well 11 and the dip n type well 38. In addition, the n type well 59 is formed at the same impurity concentration and depth as the DMOS-n type drain region 13, the HV-n type source region 27 and the HV-n type drain region 28.

In an inner region of the n type well 59 are formed a LV-p type source region 60 as one example of a low breakdown voltage source region, and a LV-p type drain region 61 as one example of a low breakdown voltage drain region, both of which are separated by a distance from each other along the front surface of the semiconductor substrate 5. A region between the LV-p type source region 60 and the LV-p type drain region 61 corresponds to a channel region (a LV-p type channel region 62) of the n type well 59.

A LV-pMOS gate insulating film 63 as one example of a low breakdown voltage gate insulating film is formed on the front surface of the semiconductor substrate 5 in the region for the LV-pMOS 9. The LV-pMOS gate insulating film 63 is formed with the same thickness as the second insulating film 15 of the DMOS gate insulating film 22. In addition, a LV-pMOS gate electrode 64 as one example of a low breakdown voltage gate electrode is formed to face the LV-p type channel region 62 with the LV-pMOS gate insulating film 63 interposed therebetween.

Both sides of the LV-pMOS gate electrode 64 are covered with a side wall 65 made of insulating material such as silicon oxide ($SiO_2$) or the like. P type low concentration layers 66 and 67 are formed between the LV-p type source region 60 and the LV-pMOS gate electrode 64 and between the LV-p type drain region 61 and the LV-pMOS gate electrode 64, respectively, i.e., in a region immediately below the side wall 65, thereby forming an LDD structure. The p type low concentration layers 66 and 67 have a concentration lower than that of the LV-p type source and drain regions 60 and 61 and are formed by implanting impurity ions at a depth shallower than these regions 60 and 61. The p type low concentration layers 66 and 67 are formed in self-alignment with the LV-pMOS gate electrode 64, while the LV-p type source and drain regions 60 and 61 are formed in self-alignment with the side wall 65.

An interlayer film 68 made of insulating material such as silicon oxide ($SiO_2$) or the like is stacked on the semiconductor substrate 6. On the interlayer film 68 are formed source wirings 69 to 73, drain wirings 74 to 78 and gate wirings 79 to 83, all of which are made of conductive material such as aluminum (Al) or the like. The source wirings 69 to 73 are connected to the DMOS-n type source region 16, the DMOS body contact region 20, the HV-n type source contact region 30, the HV-p type source contact region 42, the LV-n type source region 51 and the LV-p type source region 60, respectively via contact plugs penetrating through the interlayer film 68.

The drain wirings 74 to 78 are connected to the DMOS drain contact region 21, the HV-n type drain contact region 31, the HV-p type drain contact region 43, the LV-n type drain region 52 and the LV-p type drain region 61, respectively via contact plugs penetrating through the interlayer film 68. The gate wirings 79 to 83 are connected to the DMOS gate electrode 23, the HV-nMOS gate electrode 36, the HV-pMOS gate electrode 48, the LV-nMOS gate electrode 55 and the LV-pMOS gate electrode 64, respectively via contact plugs penetrating through the interlayer film 68.

Details of the above-described elements of the semiconductor device 1 will be further described below.

The semiconductor substrate 5 is of a p type having an impurity concentration of, for example, $1\times10^{13}$ cm$^{-3}$ to $1\times10^{15}$ cm$^{-3}$. A thickness of the semiconductor substrate 5 is, for example, 600 µm to 900 µm. The dip n type well 11 and the dip n type well 38 are of an n type having an impurity concentration of, for example, $1\times10^{15}$ cm$^{-3}$ to $5\times10^{15}$ cm$^{-3}$. A depth from the front surface of the semiconductor substrate 5 to the bottom of the dip n type wells 11 and 38 is, for example, 2 µm to 3 µm.

The DMOS-n type drain region 13, the HV-n type source region 27, the HV-n type drain region 28 and the n type well 59 are of an n type having an impurity concentration of, for example, $5\times10^{15}$ cm$^{-3}$ to $2\times10^{16}$ cm$^{-3}$. A depth from the front surface of the semiconductor substrate 5 to the bottom of the DMOS-n type drain region 13, the HV-n type source region 27, the HV-n type drain region 28 and the n type well 59 is, for example, 1 µm to 1.5 µm.

The dip p type well 26 is of a p type having an impurity concentration of, for example, $7\times10^{14}$ cm$^{-3}$ to $2\times10^{15}$ cm$^{-3}$. A depth from the front surface of the semiconductor substrate 5 to the bottom of the dip p type well 26 is, for example, 1.5 µm to 2 µm. The HV-p type source region 39, the HV-p type drain region 40 and the p type well 50 are of a p type having an impurity concentration of, for example, $5\times10^{15}$ cm$^{-3}$ to $2\times10^{16}$ cm$^{-3}$. A depth from the front surface of the semiconductor substrate 5 to the bottom of the HV-p type source region 39, the HV-p type drain region 40 and the p type well 50 is, for example, 1 µm to 1.5 µm.

The DMOS-n type source region 16, the DMOS drain contact region 21, the HV-n type source contact region 30, the HV-n type drain contact region 31, the LV-n type source region 51 and the LV-n type drain region 52 are of an n$^+$ type having an impurity concentration of, for example, $1\times10^{18}$ m$^{-3}$ to $5\times10^{18}$ cm$^{-3}$. The DMOS body contact region 20, the HV-p type source contact region 42, the HV-p type drain contact region 43, the LV-p type source region 60 and the LV-p type drain region 61 are of a p$^+$ type having an impurity concentration of, for example, $1\times10^{18}$ m$^{-3}$ to $3\times10^{18}$ cm$^{-3}$.

The DMOS-n type drift region 19 and the HV-n type drift region 34 are of an n$^+$ type having an impurity concentration of, for example, $1\times10^{15}$ m$^{-3}$ to $1\times10^{16}$ cm$^{-3}$. The HV-p type drift region 46 is of a p$^+$ type having an impurity concentration of, for example, $1\times10^{16}$ m$^{-3}$ to $5\times10^{16}$ cm$^{-3}$. A thickness of the LOCOS oxide films 18, 32, 33, 44 and 45 is, for example, 2000 Å to 3000 Å.

A thickness of the first insulating film 14 of the DMOS gate insulating film 22, the HV-nMOS gate insulating film 35 and the HV-pMOS gate insulating film 47 is, for example, 1000 Å to 1500 Å. A thickness of the second insulating film 15 of the DMOS gate insulating film 22, the LV-nMOS gate insulating film 54 and the LV-pMOS gate insulating film 63 is, for example, 80 Å to 150 Å. A thickness of the DMOS gate electrode 23, the HV-nMOS gate electrode 36, the HV-pMOS gate electrode 48, the LV-nMOS gate electrode 55 and the LV-pMOS gate electrode 64 is, for example, 2000 Å to 3000 Å.

Figure 2B:
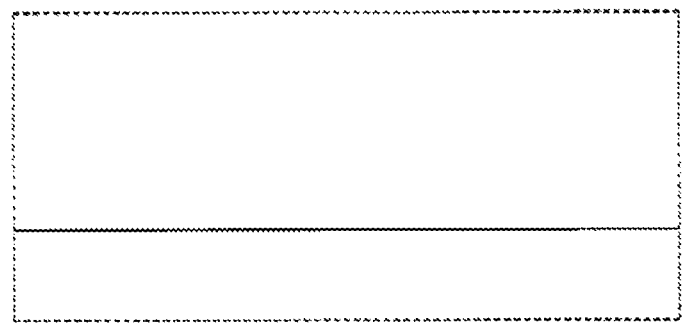

FIGS. 2A to 14B are schematic views illustrating processes of a manufacturing method of the semiconductor device 1 of FIG. 1A. In FIGS. 2A to 14B, figures denoted by 'A' correspond to sectional views of the semiconductor device 1 as illustrated in FIG. 1A during a process of the manufacturing method and figures denoted by 'B' correspond to enlarged views of the main part of the HV-DMOS region 2 as illustrated in FIG. 1B during a process of the manufacturing method. First, as shown in FIG. 2A, the element isolation portions 10 are formed on the semiconductor substrate 5 by means of a STI method. This allows active regions for the HV-DMOS 2, the HV-nMOS 6, the HV-pMOS 7, the LV-nMOS 8 and the LV-pMOS 9 to be prepared.

Figure 3B:
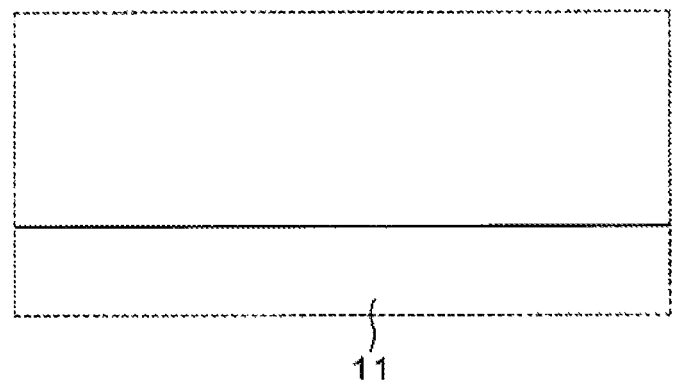

Next, as shown in FIG. 3A, a step of forming the dip n type well 11 and the dip n type well 38 and a step of forming the dip p type well 26 are performed. Specifically, a resist film (not shown) having a predetermined pattern is first formed on the semiconductor substrate 5 and then, using the resist film as a mask, n type impurity ions are selectively injected into regions where the dip n type well 11 and the dip n type well 38 are to be formed on the semiconductor substrate 5. Examples of the n type impurity ions may include As$^+$ ions and P$^+$ ions. Thus, the dip n type well 11 and the dip n type well 38 are formed simultaneously.

Similarly, a resist film (not shown) having a predetermined pattern is formed on the semiconductor substrate 5 and then, using the resist film as a mask, p type impurity ions are selectively injected into a region where the dip p type well 26 is to be formed on the semiconductor substrate 5. Examples of the p type impurity ions may include B$^+$ ions. Thus, the dip p type well 26 is formed.

Figure 4B:
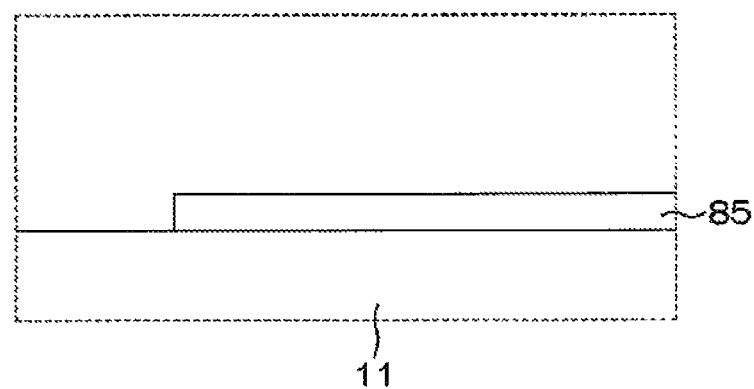

Next, as shown in FIGS. 4A and 4B, a hard mask 85 (for example, a SiN film of about 1000 Å) is stacked on the semiconductor substrate 5 and is patterned such that portions of the hard mask 85 where the LOCOS oxide films 18, 32, 33, 44 and 45 are to be formed are selectively removed.

Figure 5B:
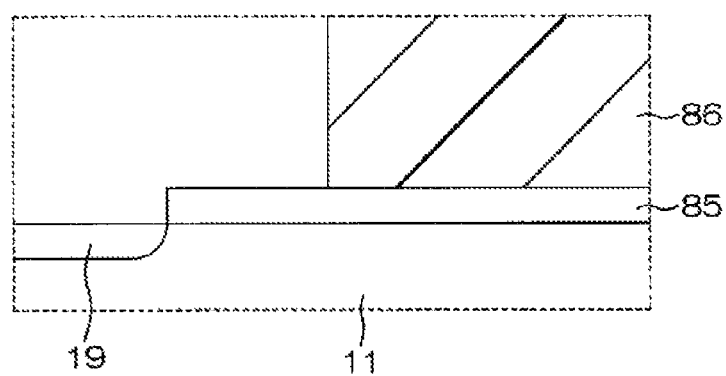

Next, as shown in FIGS. 5A and 5B, a resist film (not shown) having a predetermined pattern to selectively cover the region for the HV-DMOS 2, the region for the HV-nMOS 6 and the region for the LV-CMOS 4 is formed on the semiconductor substrate 5 and then, using this resist film and the hard mask 85 as a mask, p type impurity ions are injected into the semiconductor substrate 5 selectively exposed from the hard mask 85. Thus, the HV-p type drift region 46 is formed.

Similarly, a resist film 86 having a predetermined pattern to selectively cover the region for the HV-pMOS 7 and the region for the LV-CMOS 4 is formed on the semiconductor substrate 5 and then, using the resist film 86 and the hard mask 85 as a mask, n type impurity ions are injected into the semiconductor substrate 5 selectively exposed from the hard mask 85. Thus, the DMOS-n type drift region 19 and the HV-n type drift region 34 are formed simultaneously.

Figure 6A:
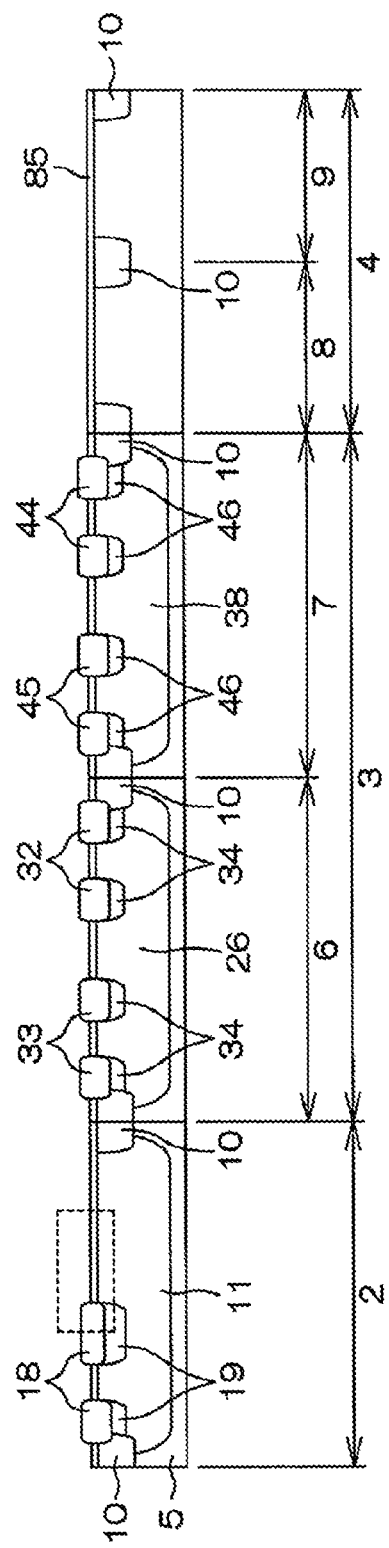
FIGS. 6A and 6B are schematic views showing a process subsequent to the process of FIGS. 5A and 5B.
Figure 6B:
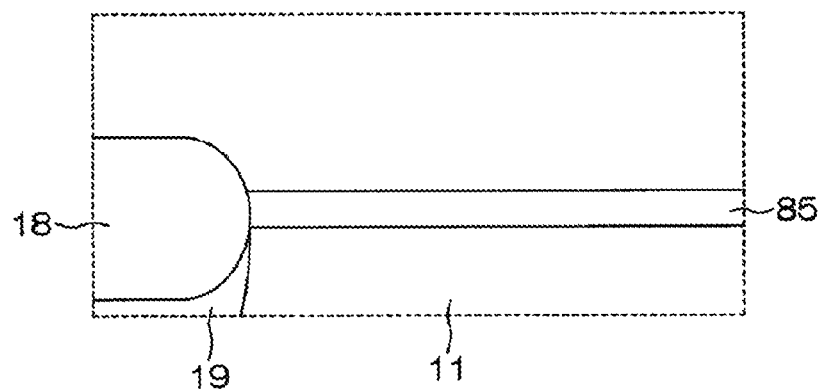

Next, as shown in FIGS. 6A and 6B, the semiconductor substrate 5 selectively exposed from the hard mask 85 is selectively and thermally oxidized to form the LOCOS oxide films 18, 32, 33, 44 and 45 simultaneously. At this time, since regions other than the regions where the LOCOS oxide films 18, 32, 33, 44 and 45 are to be formed are covered by the hard mask 85, it is possible to prevent the bird's beak of the LOCOS oxide films 18, 32, 33, 44 and 45 from contacting a portion where the DMOS channel region 17, the HV-n type channel region 29 and the HV-p type channel region 41 are to be formed.

Figure 7A:
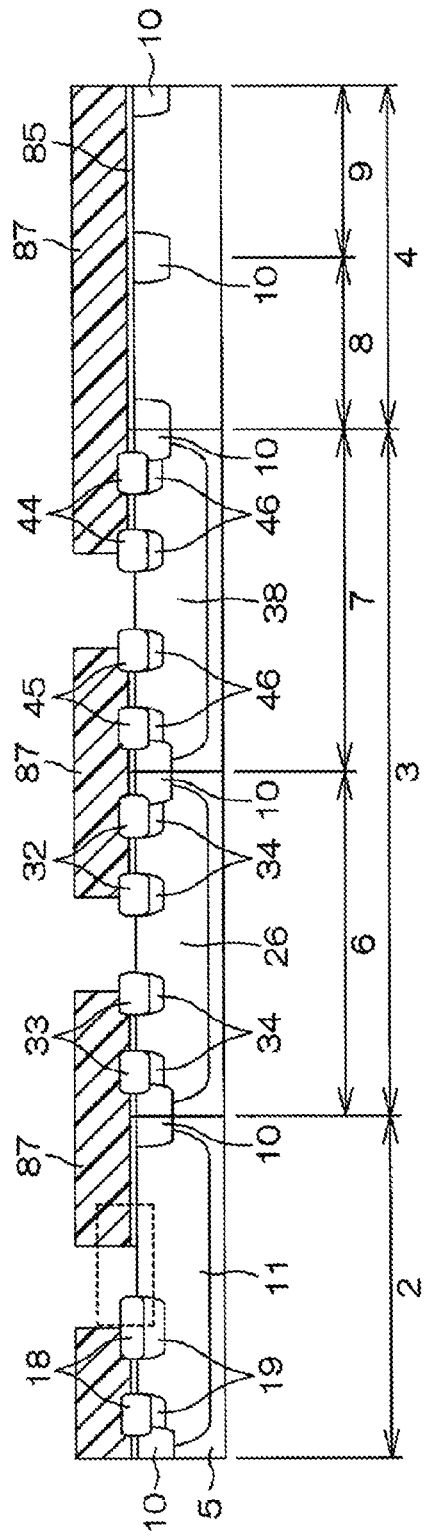
FIGS. 7A and 7B are schematic views showing a process subsequent to the process of FIGS. 6A and 6B.
Figure 7B:
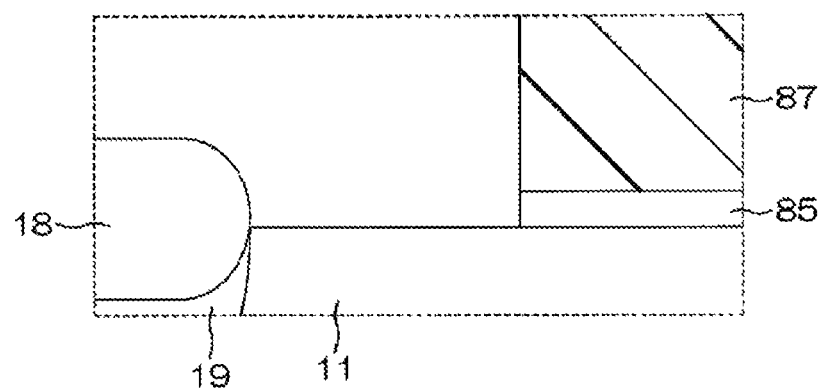

Next, as shown in FIGS. 7A and 7B, a resist film 87 is stacked on the semiconductor substrate 5 and is patterned to selectively remove a portion where the first insulating film 14 of the DMOS gate insulating film 22, the HV-nMOS gate insulating film 35 and the HV-pMOS gate insulating film 47 of the resist film 87 are to be formed. Then, using the resist film 87 as a mask, the hard mask 85 exposed from the resist film 87 is selectively removed.

Figure 8B:
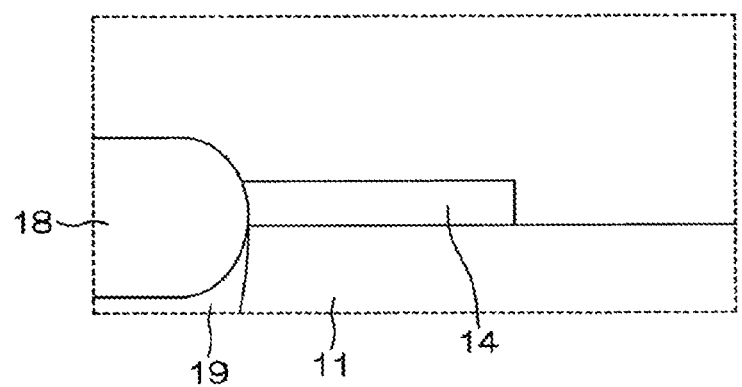
Figure 9A:
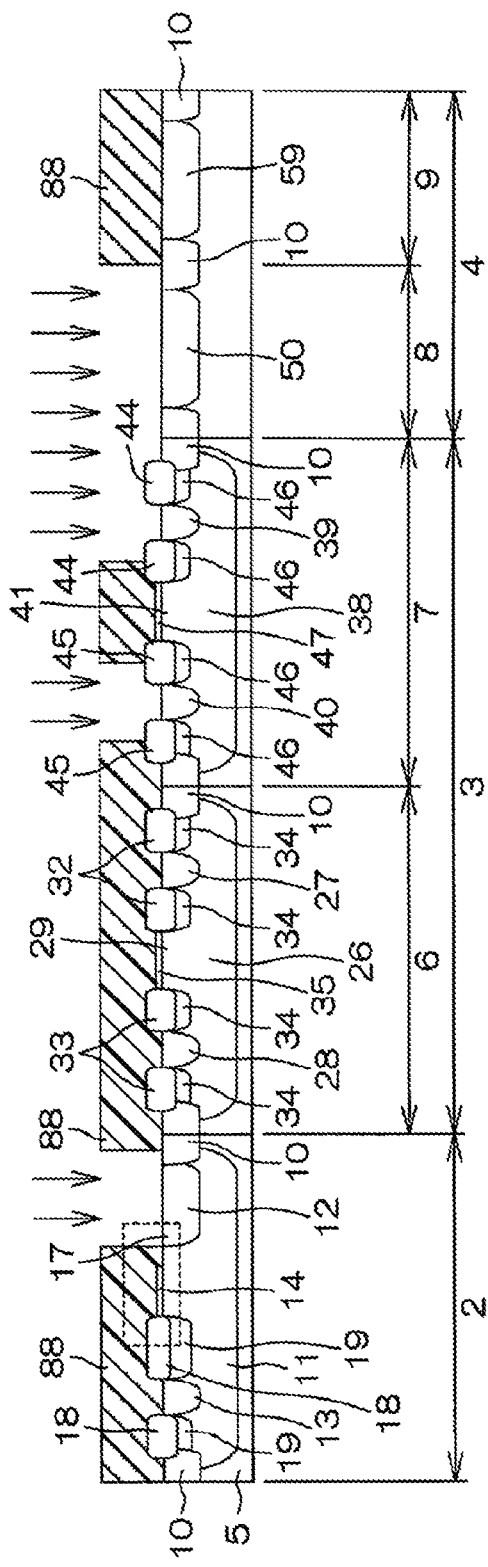
FIGS. 9A and 9B are schematic views showing a process subsequent to the process of FIGS. 8A and 8B.
Figure 9B:
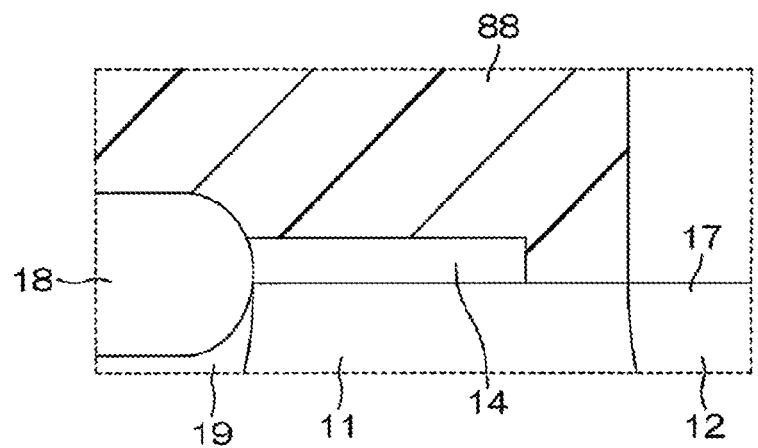

Next, as shown in FIGS. 8A and 8B, the semiconductor substrate 5 selectively exposed from the hard mask 85 is selectively thermally oxidized to form the first insulating film 14 of the DMOS gate insulating film 22, the HV-nMOS gate insulating film 35 and the HV-pMOS gate insulating film 47 simultaneously. Thereafter, the hard mask 85 is removed. Next, as shown in FIGS. 9A and 9B, a step of forming the DMOS-n type drain region 13, the HV-n type source region 27, the HV-n type drain region 28 and the n type well 59 simultaneously and a step of forming the DMOS-p type body region 12, the HV-p type source region 39, the HV-p type drain region 40 and the p type well 50 are performed simultaneously.

Specifically, a resist film (not shown) having a predetermined pattern is formed on the semiconductor substrate 5 and then, using the resist film as a mask, n type impurity ions are selectively injected into a region where the DMOS-n type drain region 13, the HV-n type source region 27, the HV-n type drain region 28 and the n type well 59 are to be formed on the semiconductor substrate 5. Thus, the DMOS-n type drain region 13, the HV-n type source region 27, the HV-n type drain region 28 and the n type well 59 are formed simultaneously.

Similarly, a resist film 88 having a predetermined pattern is formed on the semiconductor substrate 5 and then, using the resist film 88 as a mask, p type impurity ions are selectively injected into a region where the DMOS-p type body region 12, the HV-p type source region 39, the HV-p type drain region 40 and the p type well 50 are to be formed on the semiconductor substrate 5. Thus, the DMOS-p type body region 12, the HV-p type source region 39, the HV-p type drain region 40 and the p type well 50 are formed simultaneously.

Figure 10B:
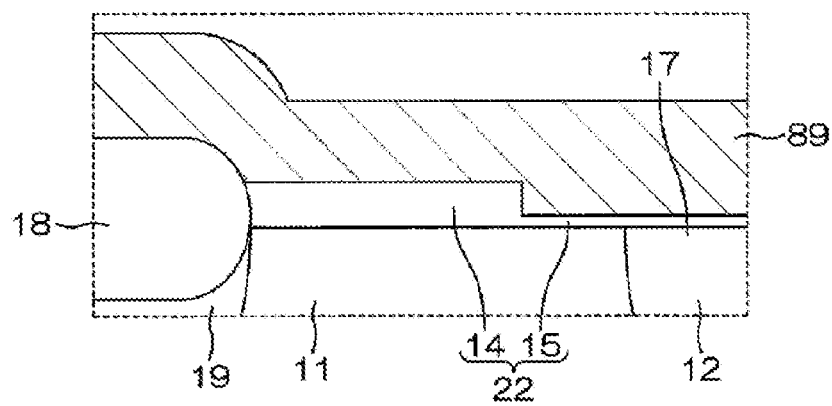
Figure 11A:
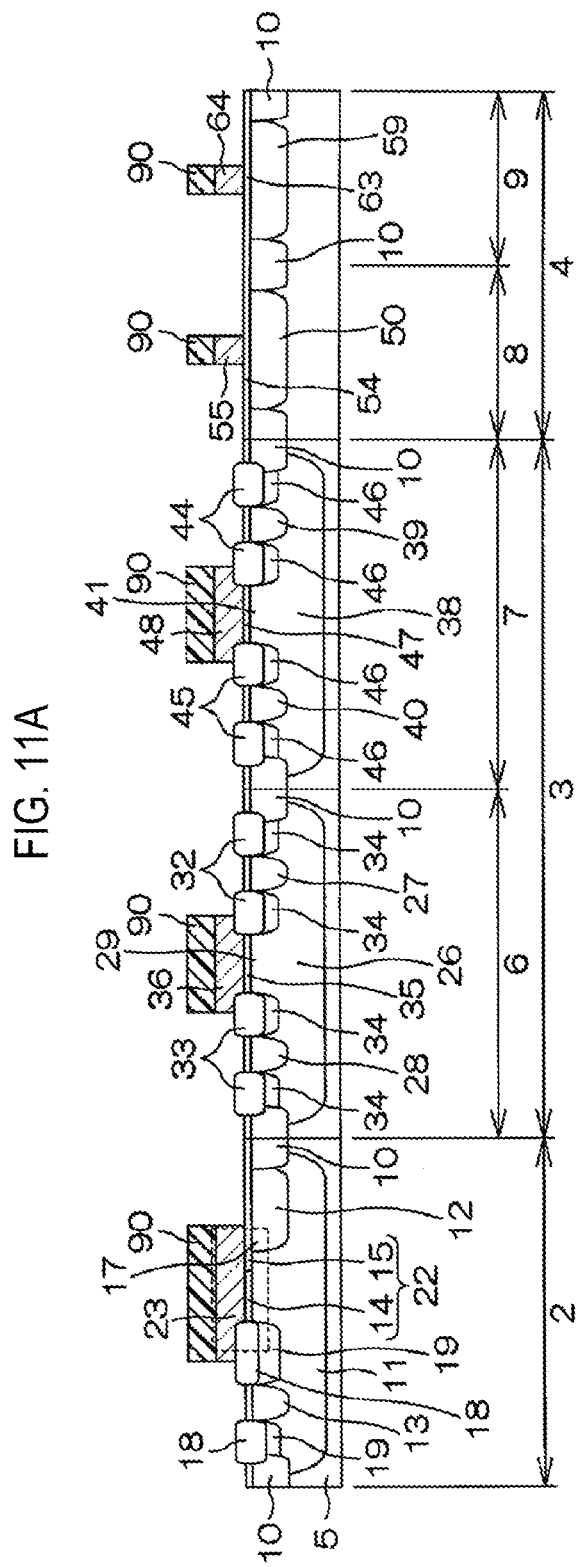
FIGS. 11A and 11B are schematic views showing a process subsequent to the process of FIGS. 10A and 10B.
Figure 11B:
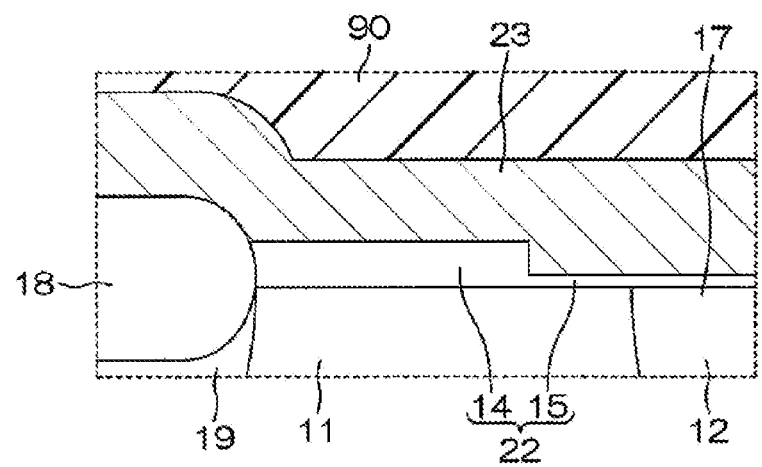

Next, as shown in FIGS. 10A and 10B, the semiconductor substrate 5 is selectively and thermally oxidized to form the second insulating film 15 of the DMOS gate insulating film 22, the LV-nMOS gate insulating film 54 and the LV-pMOS gate insulating film 63 simultaneously. Then, polysilicon material 89 is deposited on the semiconductor substrate 5. Next, as shown in FIGS. 11A and 11B, a resist film 90 having a predetermined pattern is formed on the polysilicon material 89, and then, using the resist film 90 as a mask, the polysilicon material 89 is selectively removed. Thus, the DMOS gate electrode 23, the HV-nMOS gate electrode 36, the HV-pMOS gate electrode 48, the LV-nMOS gate electrode 55 and the LV-pMOS gate electrode 64 are formed simultaneously.

Figure 12A:
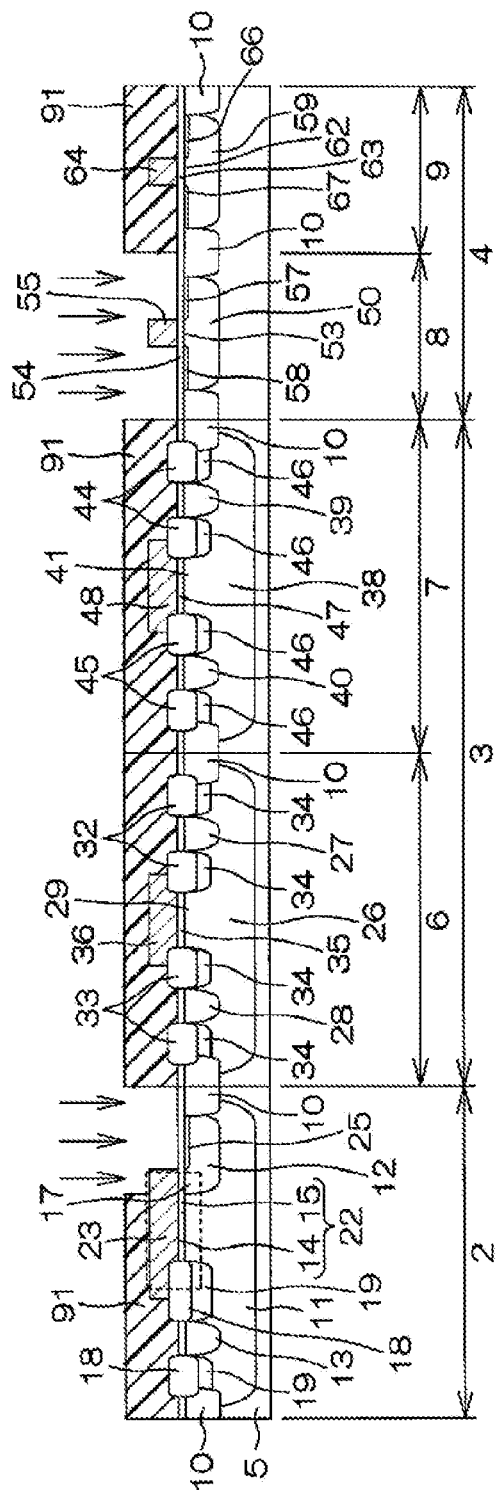
FIGS. 12A and 12B are schematic views showing a process subsequent to the process of FIGS. 11A and 11B.
Figure 12B:
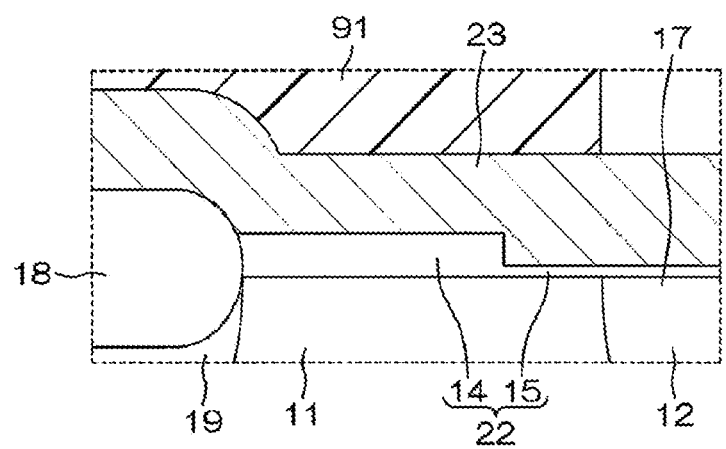

Next, as shown in FIGS. 12A and 12B, a resist film (not shown) having a predetermined pattern is formed on the semiconductor substrate 5 and then, using this resist film as a mask, p type impurity ions are selectively injected into a region where the p type low concentration layers 66 and 67 are to be formed on the semiconductor substrate 5. Thus, the p type low concentration layers 66 and 67 are formed simultaneously. Similarly, a resist film 91 having a predetermined pattern is formed on the semiconductor substrate 5 and then, using the resist film 91 as a mask, n type impurity ions are selectively injected into a region where the n type low concentration layers 25, 57 and 58 are to be formed on the semiconductor substrate 5. Thus, the n type low concentration layers 25, 57 and 58 are formed simultaneously.

Figure 13A:
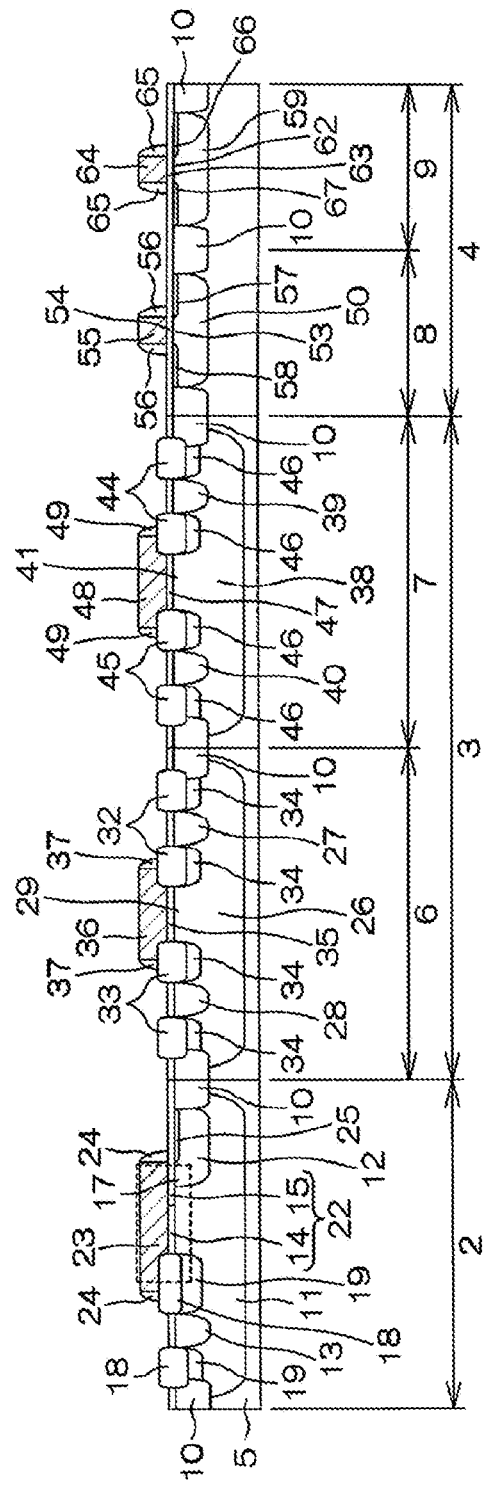
FIGS. 13A and 13B are schematic views showing a process subsequent to the process of FIGS. 12A and 12B.
Figure 13B:
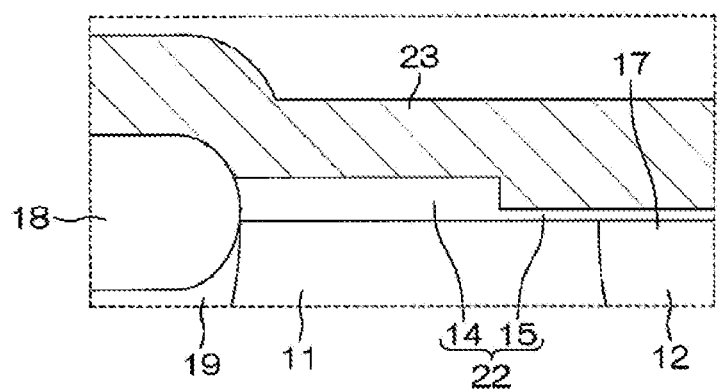

Next, as shown in FIGS. 13A and 13B, an insulating film such as a silicon oxide (SiO$_2$) film, a silicon nitride (SiN) film or the like is deposited by 1000 Å to 3000 Å on the entire surface of the semiconductor substrate 5 using a CVD method and then is etched back by dry etching. When the etch back is performed until the gate electrodes 23, 36, 48, 55 and 64 are exposed, the side walls 24, 37, 49, 56 and 65 are formed simultaneously in both sides thereof.

Figure 14A:
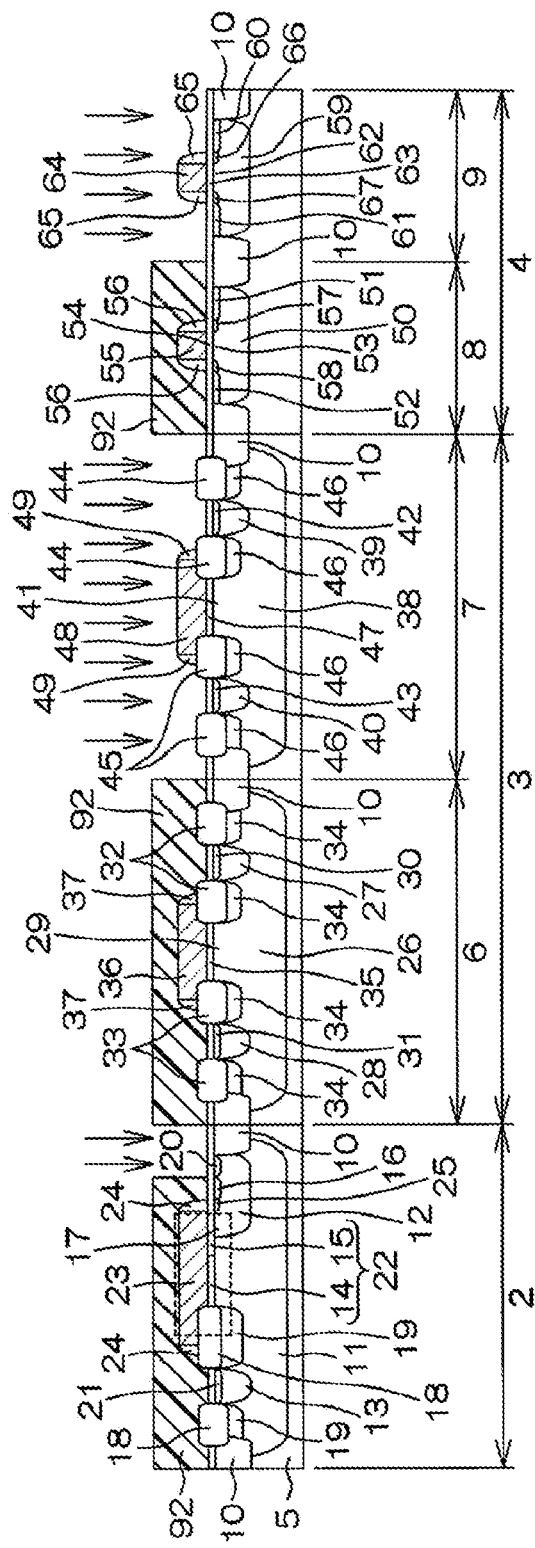
FIGS. 14A and 14B are schematic views showing a process subsequent to the process of FIGS. 13A and 13B.
Figure 14B:
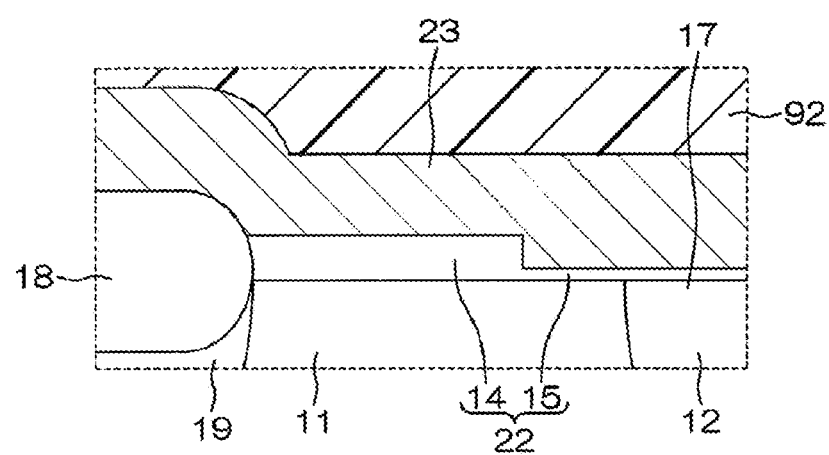

Next, as shown in FIGS. 14A and 14B, a resist film (not shown) having a predetermined pattern is formed on the semiconductor substrate 5 and then, using this resist film as a mask, n type impurity ions are selectively injected into a region where the DMOS-n type source region 16, the DMOS drain contact region 21, the HV-n type source contact region 30, the HV-n type drain contact region 31, the LV-n type source region 51 and the LV-n type drain region 52 are to be formed on the semiconductor substrate 5. Thus, the DMOS-n type source region 16, the DMOS drain contact region 21, the HV-n type source contact region 30, the HV-n type drain contact region 31, the LV-n type source region 51 and the LV-n type drain region 52 are formed simultaneously.

Similarly, a resist film 92 having a predetermined pattern is formed on the semiconductor substrate 5 and then, using the resist film 92 as a mask, p type impurity ions are selectively injected into a region where the DMOS body contact region 20, the HV-p type source contact region 42, the HV-p type drain contact region 43, the LV-p type source region 60 and the LV-p type drain region 61 are to be formed on the semiconductor substrate 5. Thus, the DMOS body contact region 20, the HV-p type source contact region 42, the HV-p type drain contact region 43, the LV-p type source region 60 and the LV-p type drain region 61 are formed simultaneously.

Next, the interlayer film 68 covering the entire surface of the semiconductor substrate 5 is formed, a plurality of contact holes is formed in the interlayer film 68, and contact plugs are embedded in the contact holes. Finally, the semiconductor device 1 of FIG. 1A is completed by performing a step of forming the source wirings 69 to 73, the drain wirings 74 to 78 and the gate wirings 79 to 83 on the interlayer film 68.

As described above, in the semiconductor device 1, since the DMOS gate insulating film 22 is interposed between the LOCOS oxide film 18 and the DMOS channel region 17, it is possible to prevent the DMOS channel region 17 from being covered by the LOCOS oxide film 18. In addition, as shown in FIG. 1B, the relatively thin second insulating film 15 is formed on the DMOS channel region 17 of the DMOS gate insulating film 22. This allows the HV-DMOS 2 to be controlled by a proper gate voltage, thereby achieving sufficient transistor performance.

In addition, since the first insulating film 14 thicker than the second insulating film 15 is disposed as a portion outside the DMOS channel region 17 of the DMOS gate insulating film 22, a gate-drain breakdown voltage can be sufficiently maintained. In addition, the first insulating film 14 can be formed using the same process as the HV-nMOS gate insulating film 35 and the HV-pMOS gate insulating film 47 (see FIGS. 8A and 8B) and the second insulating film 15 can be formed using the same process as the LV-nMOS gate insulating film 54 and the LV-pMOS gate insulating film 63 (see FIGS. 10A and 10B), thereby simplifying the manufacturing method of the semiconductor device 1.

In addition, the DMOS-n type drift regions 19 are formed below the LOCOS oxide films 18, the HV-n type drift regions 34 are formed below the LOCOS oxide films 32 and 33, and the HV-p type drift regions 46 are formed below the LOCOS oxide films 44 and 45. Accordingly, parasite resistance of the drain of the HV-DMOS 2 can be lowered by the DMOS-n type drift regions 19, and parasite resistance of the drains of the HV-nMOS 6 and the HV-pMOS 7 can be lowered by the HV-n type drift regions 34 and the HV-p type drift regions 46, respectively. In addition, the DMOS-n type drift regions 19 are formed in a self-aligned manner below the LOCOS oxide films 18, the HV-n type drift regions 34 are formed in a self-aligned manner below the LOCOS oxide films 32 and 33, and the HV-p type drift regions 46 are formed in a self-aligned manner below the LOCOS oxide films 44 and 45. The DMOS-n type drift regions 19, the HV-n type drift regions 34, and the HV-p type drift regions 46 are separated by a distance from the DMOS channel region 17, the HV-n type channel region 29 and the HV-p type channel region 41, respectively. This can prevent the drift regions 19, 34 and 46 from contacting the channel regions 17, 29 and 41, thereby preventing decrease in a junction breakdown voltage due to such contact.

Although the embodiments of the present disclosure have been illustrated in the above, the present disclosure may be practiced in different ways. For example, the conductivity type of semiconductors in the semiconductor device 1 may be reversed. For example, p type portions in the semiconductor device 1 may be changed to n type portions and vice versa. The present disclosure may be changed in design in different ways within the technical scope of the subject matters defined in the claim.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device including a high breakdown voltage DMOS (Double-diffused Metal Oxide Semiconductor) transistor formed on a first conductivity type semiconductor substrate, comprising:
    a DMOS second conductivity type well formed in a region for the high breakdown voltage DMOS transistor of the semiconductor substrate;
    a DMOS first conductivity body region formed in an inner region of the DMOS second conductivity type well;
    a DMOS second conductivity type source region formed in an inner region of the DMOS first conductivity type body region;
    a DMOS second conductivity type drain region formed in an inner region of the DMOS second conductivity type well and separated by a distance from the DMOS first conductivity type body region;
    a LOCOS oxide film formed between the DMOS second conductivity type drain region and the DMOS first conductivity type body region, the LOCOS oxide film being adjacent to the DMOS second conductivity type drain region;
    a DMOS gate insulating film formed in succession to the LOCOS oxide film to cover a DMOS channel region between the DMOS second conductivity type source region and the DMOS second conductivity type well, the DMOS gate insulating film being thinner than the LOCOS oxide film;
    a DMOS second conductivity type drift region formed below the LOCOS oxide film of the semiconductor substrate; and
    a DMOS gate electrode formed to straddle the LOCOS oxide film and the DMOS gate insulating film, the DMOS gate electrode facing the DMOS channel region through the DMOS gate insulating film,
    wherein the DMOS gate insulating film includes a first gate insulating film which is disposed outside the DMOS channel region and a second gate insulating film which is disposed in the DMOS channel region and is thinner than the first insulating film,
    wherein a boundary between the first and second gate insulating films is located above the DMOS second conductivity type well and outside the DMOS channel region, and
    wherein the DMOS gate insulating film including the first and second gate insulating films is formed over a region which is different from the DMOS second conductivity type drift region where the LOCOS oxide film is formed.

2. The semiconductor device of claim 1, further comprising:
    a high breakdown voltage CMOS transistor and a low breakdown voltage CMOS transistor formed on the semiconductor substrate;
    a high breakdown voltage source region and a high breakdown voltage drain region formed in a region for the high breakdown voltage CMOS transistor of the semiconductor substrate and separated by a distance from each other;
    a high breakdown voltage gate insulating film formed to cover a high breakdown channel region between the high breakdown voltage source region and the high breakdown voltage drain region;
    a high breakdown voltage gate electrode formed on the high breakdown voltage gate insulating film and facing the high breakdown voltage channel region via the high breakdown voltage gate insulating film;
    a low breakdown voltage source region and a low breakdown voltage drain region formed in a region for the low breakdown voltage CMOS transistor of the semiconductor substrate and separated by a distance from each other;
    a low breakdown voltage gate insulating film formed to cover a low breakdown channel region between the low breakdown voltage source region and the low breakdown voltage drain region; and
    a low breakdown voltage gate electrode formed on the low breakdown voltage gate insulating film and facing the low breakdown voltage channel region via the low breakdown voltage gate insulating film,
    wherein the first gate insulating film of the DMOS gate insulating film has the same thickness as the high breakdown voltage gate insulating film, and the gate second insulating film of the DMOS gate insulating film has the same thickness as the low breakdown voltage gate insulating film.

3. The semiconductor device of claim 2, further comprising an element isolation portion having a STI (Shallow Trench Isolation) structure in which grooves dug down from the front surface of the semiconductor substrate are filled with insulating material, the element isolation portion partitioning regions for the high breakdown voltage DMOS transistor, the high breakdown voltage CMOS transistor and the low breakdown voltage CMOS transistor.

4. The semiconductor device of claim 3, wherein the region for the low breakdown voltage CMOS transistor partitioned by the element isolation portion has a size equal to or less than 0.18μm.

5. The semiconductor device of claim 1, wherein the DMOS second conductivity type drift region has an impurity concentration higher than that of the DMOS second conductivity type well.

6. The semiconductor device of claim 1, wherein the thickness of the LOCOS oxide film is 2000Å to 3000Å, the thickness of the first gate insulating film is 1000Å to 1500Å and the thickness of the second gate insulating film is 80Å to 150Å.

7. The semiconductor device of claim 1, wherein the boundary between the first and second gate insulating films is located directly above the DMOS second conductivity type well and outside the DMOS channel region, and directly contacts the DMOS second conductivity type well.

8. The semiconductor device of claim 1, wherein the DMOS second conductivity type drift region formed below an entire area of the LOCOS oxide film of the semiconductor substrate.

9. The semiconductor device of claim 1, wherein the region on which the DMOS gate insulating film is formed is a region other than a region where the DMOS second conductivity type drift region is formed.

10. The semiconductor device of claim 1, wherein the region on which the DMOS gate insulating film is formed is a region other than a region where the DMOS second conductivity type drain region is formed.

11. The semiconductor device of claim 1, wherein the boundary between the first and second gate insulating films is separately located from an end of the LOCOS oxide film.

12. A semiconductor device including a high breakdown voltage DMOS (Double-diffused Metal Oxide Semiconductor) transistor formed on a first conductivity type semiconductor substrate, comprising:
   a DMOS second conductivity type well formed in a region for the high breakdown voltage DMOS transistor of the semiconductor substrate;
   a DMOS first conductivity body region formed in an inner region of the DMOS second conductivity type well;
   a DMOS second conductivity type source region formed in an inner region of the DMOS first conductivity type body region;
   a DMOS second conductivity type drain region formed in an inner region of the DMOS second conductivity type well and separated by a distance from the DMOS first conductivity type body region;
   a LOCOS oxide film formed between the DMOS second conductivity type drain region and the DMOS first conductivity type body region, the LOCOS oxide film being adjacent to the DMOS second conductivity type drain region;
   a DMOS gate insulating film formed in succession to the LOCOS oxide film to cover a DMOS channel region between the DMOS second conductivity type source region and the DMOS second conductivity type well, the DMOS gate insulating film being thinner than the LOCOS oxide film, the DMOS gate insulating film including
      a first gate insulating film which is disposed outside the DMOS channel region and
      a second gate insulating film which is disposed in the DMOS channel region and is thinner than the first gate insulating film, wherein
      a boundary between the first and second gate insulating films is located above the DMOS second conductivity type well and outside the DMOS channel region; and
   a DMOS gate electrode formed to straddle the LOCOS oxide film and the DMOS gate insulating film, the DMOS gate electrode facing the DMOS channel region through the DMOS gate insulating film.

13. The semiconductor device of claim 12, wherein the boundary between the first and second gate insulating films is separately located from an end of the LOCOS oxide film.

* * * * *